(12) United States Patent
Li

(10) Patent No.: US 9,647,244 B2
(45) Date of Patent: May 9, 2017

(54) INTEGRATION EQUIPMENT FOR REPLACING AN EVAPORATION MATERIAL AND USE METHOD FOR THE SAME

(71) Applicant: Shenzhen China Star Optoelectronics Technology Co., Ltd., Shenzhen (CN)

(72) Inventor: Jinchuan Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 116 days.

(21) Appl. No.: 14/781,586

(22) PCT Filed: Apr. 1, 2015

(86) PCT No.: PCT/CN2015/075688
§ 371 (c)(1),
(2) Date: Oct. 1, 2015

(87) PCT Pub. No.: WO2016/123853
PCT Pub. Date: Aug. 11, 2016

(65) Prior Publication Data
US 2016/0365542 A1    Dec. 15, 2016

(30) Foreign Application Priority Data
Feb. 4, 2015  (CN) .......................... 2015 1 0060026

(51) Int. Cl.
*C23C 14/24*  (2006.01)
*C23C 14/56*  (2006.01)
(Continued)

(52) U.S. Cl.
CPC .............. *H01L 51/56* (2013.01); *C23C 14/24* (2013.01); *C23C 14/246* (2013.01); *C23C 14/56* (2013.01);
(Continued)

(58) Field of Classification Search
USPC ......................................................... 438/478
See application file for complete search history.

(56) References Cited

U.S. PATENT DOCUMENTS

| 4,401,052 | A * | 8/1983 | Baron | C23C 14/24 |
| | | | | 118/715 |
| 6,467,427 | B1 * | 10/2002 | Peng | C23C 14/246 |
| | | | | 118/723 VE |

(Continued)

FOREIGN PATENT DOCUMENTS

| CN | 201793730 U | 4/2011 |
| CN | 203307423 U | 11/2013 |
| CN | 103526164 A | 1/2014 |

*Primary Examiner* — Zandra Smith
*Assistant Examiner* — Lawrence Tynes, Jr.
(74) *Attorney, Agent, or Firm* — Leong C. Lei

(57) ABSTRACT

An integration equipment for replacing an evaporation material and a use method thereof are provided. The integration equipment includes an evaporation chamber region, a material replacing chamber region, a valve door disposed between the evaporation chamber region and the material replacing chamber region, and for separating the above two regions, a substrate disposed inside the evaporation chamber region, and a material feeding door disposed at a side of the material replacing chamber region away from the valve door. Each of the evaporation chamber region and the material replacing chamber region includes a carrying platform, multiple evaporation sources disposed on the carrying platform, multiple exchanging devices for fixing and delivering the multiple evaporation sources, an independent vacuum-pumping device, and a heating device disposed inside the carrying platform. The equipment is capable of replacing and preheating an evaporation material without breaking vacuum of the evaporation chamber region to increase production efficiency.

13 Claims, 3 Drawing Sheets

(51) Int. Cl.
*H01L 51/56* (2006.01)
*H01L 51/00* (2006.01)
*H01L 51/50* (2006.01)
(52) U.S. Cl.
CPC ........ *H01L 51/001* (2013.01); *H01L 51/5012* (2013.01)

(56) References Cited

U.S. PATENT DOCUMENTS

| | | | | |
|---|---|---|---|---|
| 6,696,096 | B2* | 2/2004 | Tsubaki | C23C 14/12 313/504 |
| 8,119,189 | B2* | 2/2012 | Yamazaki | C23C 14/044 427/255.5 |
| 2002/0155632 | A1* | 10/2002 | Yamazaki | C23C 14/021 438/29 |
| 2004/0211526 | A1* | 10/2004 | Chang | C23C 14/24 159/49 |
| 2011/0151121 | A1* | 6/2011 | Chang | B05D 1/60 427/255.6 |
| 2011/0267815 | A1* | 11/2011 | Ghiu | F21V 29/56 362/235 |

* cited by examiner ized WOLED, an
INTEGRATION EQUIPMENT FOR REPLACING AN EVAPORATION MATERIAL AND USE METHOD FOR THE SAME

BACKGROUND OF THE INVENTION

1. Field of the Invention

The present invention relates to a manufacturing process of an organic light-emitting diode display device, and more particularly to an integration equipment for replacing an evaporation material and use method for the same.

2. Description of Related Art

An Organic Light-Emitting Diode (OLED) is a display technology having broad prospects for development. The OLED has a very excellent display performance. Specifically, features of self-illumination, simple structure, ultra-thin, fast response, wide viewing angle, low power consumption and can realize flexible display and so on. Therefore, the OLED has been called as a "Dream display". Therefore, the OLED is popular to main display manufacturers, and has become a mainstream of the third-generation display in the display technology field. Currently, the OLED device is ready for a mass production. With further research and new technologies continuing to emerge, the OLED device will have a breakthrough development.

The OLED device usually includes: a substrate, an anode formed on the substrate, a hole injection layer formed on the anode, a hole transport layer formed on the hole injection layer, a light-emitting layer on the hole transport layer, an electron transport layer formed on the light-emitting layer, an electron injection layer formed on the electron transport layer and a cathode formed on the electron injection layer. The manufacturing method for a conventional OLED display device is mainly a vacuum thermal evaporation method, and suing an evaporation equipment to form a film on an Indium-Tin-Oxide (ITO) anode layer using an organic material by a vacuum thermal evaporation method. Then, a metal cathode is deposited by a vacuum thermal evaporation method or a sputtering method.

An implementation method for a full color OLED device is superposing a White Organic Light Emitting Diode (WOLED) with a Color Filter (CF).

With the development of a large-sized WOLED, an OLED production line is developed to a G8.5 generation, and the size of the glass substrate reaches 2250×2500 mm. Therefore, a chamber volume of an evaporation equipment is above 30 m³. For the chamber with so large volume, a time for vacuuming is long. At least 5 hours is required to make an internal pressure of the chamber to be below $5 \times 10^{-5}$ Pa in order to meet a vacuum condition for production. Accordingly, when using the conventional evaporation equipment to perform a vacuum evaporation process, each time when an evaporation material is exhausted, the chamber has to be opened to break the vacuum. After an evaporation material is refilled in the chamber, vacuuming the chamber again. When the chamber reach a high vacuum state satisfied for the requirement, heating up the evaporation material. A time for replacing the evaporation material and heating up to restore a production takes 10 hours above. The above process happens once a week in a normal production process, and much production time is wasted so as to reduce the production efficiency, affect the production capacity, increase the production cost and reduce the competitiveness of an enterprise.

SUMMARY OF THE INVENTION

The purpose of the present invention is to provide an integration equipment for replacing an evaporation material. The equipment is capable of replacing and preheating an evaporation material without breaking vacuum of the evaporation chamber region to increase production efficiency, increase a production capacity, reduce a production cost, and increase the competitiveness of an enterprise.

The present invention also provides a use method for an integration equipment for replacing an evaporation material. Before replacing an evaporation material which is exhausted, an evaporation material which is unconsumed is preheated. After replacing the evaporation material which is exhausted, a heating process for a long time does not require, and the evaporation process can be executed immediately in order to greatly reduce the waste of the production time, increase production efficiency, increase a production capacity, reduce a production cost, and increase the competitiveness of an enterprise.

In order to achieve the above purpose, the present invention provides an integration equipment for replacing an evaporation material, comprising: an evaporation chamber region, a material replacing chamber region, a valve door disposed between the evaporation chamber region and the material replacing chamber region, and for separating the evaporation chamber region and the material replacing chamber region;

wherein, each of the evaporation chamber region and the material replacing chamber region includes a carrying platform, multiple evaporation sources disposed on the carrying platform, multiple exchanging devices for fixing and delivering the multiple evaporation sources, an independent vacuum-pumping device, and a heating device disposed inside the carrying platform;

wherein, a substrate disposed inside the evaporation chamber region; a material feeding door disposed at a side of the material replacing chamber region away from the valve door;

wherein, an interior of the evaporation chamber region continuously maintains a high vacuum state; during an evaporation process, the valve door is closed, and a preheating process for the multiple evaporation sources in the evaporation chamber region and a preheating process for the multiple evaporation sources in the material replacing chamber region are both executed at the same time; when executing an evaporation material replacing process, the valve door is opened, and multiple exchanging devices exchanges the evaporation source which is exhausted inside evaporation chamber region with the evaporation source which is unconsumed inside the material replacing chamber region; when executing a material filling process, the valve door is closed and the material feeding door is opened, and filling an evaporation material for the evaporation source which is exchanged and exhausted inside the material replacing chamber.

Wherein, the valve door is a pneumatic valve door.

Wherein, each of the multiple evaporation sources includes a crucible and an evaporation material filled in the crucible.

Wherein, each of the carrying platforms and the multiple exchanging devices has a 360-degrees-rotation function such that when the substrate is located at different locations in the evaporation chamber region, the carrying platform and the exchanging devices inside the evaporation chamber region work together such that a vapor outlet of one of the evaporation sources inside the evaporation chamber region directly faces the substrate.

Wherein, each of the exchanging devices is a retractable linkage structure; one terminal of each exchanging device is fixed at a base seat and the other terminal of each exchanging device fixes a corresponding evaporation source through a fixture.

In order to achieve the above purpose, the present invention also provides an integration equipment for replacing an evaporation material, comprising: an evaporation chamber region, a material replacing chamber region, a valve door disposed between the evaporation chamber region and the material replacing chamber region, and for separating the evaporation chamber region and the material replacing chamber region;

wherein, each of the evaporation chamber region and the material replacing chamber region includes a carrying platform, multiple evaporation sources disposed on the carrying platform, multiple exchanging devices for fixing and delivering the multiple evaporation sources, an independent vacuum-pumping device, and a heating device disposed inside the carrying platform;

wherein, a substrate disposed inside the evaporation chamber region; a material feeding door disposed at a side of the material replacing chamber region away from the valve door;

wherein, an interior of the evaporation chamber region continuously maintains a high vacuum state; during an evaporation process, the valve door is closed, and a preheating process for the multiple evaporation sources in the evaporation chamber region and a preheating process for the multiple evaporation sources in the material replacing chamber region are both executed at the same time; when executing an evaporation material replacing process, the valve door is opened, and multiple exchanging devices exchanges the evaporation source which is exhausted inside evaporation chamber region with the evaporation source which is unconsumed inside the material replacing chamber region; when executing a material filling process, the valve door is closed and the material feeding door is opened, and filling an evaporation material for the evaporation source which is exchanged and exhausted inside the material replacing chamber;

wherein, the valve door is a pneumatic valve door;

wherein, each of the multiple evaporation sources includes a crucible and an evaporation material filled in the crucible.

The present invention also provides a use method for an integration equipment for replacing an evaporation material, comprising:

step 1: providing an integration equipment for replacing an evaporation material, and an evaporation material;

wherein, the integration equipment for replacing an evaporation material includes an evaporation chamber region, a material replacing chamber region and a valve door for separating and disposed between the evaporation chamber region and the material replacing chamber; each of the evaporation chamber region and the material replacing chamber region includes a carrying platform provided inside, multiple evaporation sources disposed on the carrying platform, multiple exchanging devices for fixing and delivering the multiple evaporation sources and an independent vacuum-pumping device; a heating device is disposed inside each carrying platform; a substrate is provided inside the evaporation chamber region; a side of the material replacing chamber region away from the valve door is provided with a material feeding door;

a portion of locations of the carrying platform inside the material replacing chamber region is empty;

step 2: closing the material feeding door and the valve door, vacuuming the evaporation chamber region and material replacing chamber region through the independent vacuum-pumping devices respectively, and executing a preheating process for the evaporation sources in the evaporation chamber region and a preheating process for the evaporation sources in the material replacing chamber region through the heating devices in the carrying platforms at the same time;

step 3: when one evaporation sources inside the evaporation chamber region is exhausted, opening the valve door, through the exchanging devices to exchange the one evaporation source which is exhausted in the evaporation chamber region with an evaporation source which is unconsumed in the material replacing chamber region, then, closing the valve door, and continue to execute an evaporation process in the evaporation chamber region; and step 4: when the evaporation process is executed normally in the evaporation chamber region and after breaking vacuum to the material replacing chamber region, opening the material feeding door, filling an evaporation material for the evaporation source which is exchanged and exhausted inside the material replacing chamber, closing the material feeding door after finishing filling, vacuuming the material replacing chamber region again, preheating the evaporation source after being filled with the evaporation material through the heating device inside the carrying platform, and waiting for a next exchange.

Wherein the step 3 specifically includes:

step 31: moving an evaporation source which is exhausted inside the evaporation chamber region to the valve door, and opening the valve door;

step 32: moving an empty location of the carrying platform in the material replacing chamber region to the valve door, placing the evaporation source which is exhausted inside the evaporation chamber region to the empty location through the exchanging devices;

step 33: moving a location of the carrying platform in the material replacing chamber region corresponding to the evaporation source which is unconsumed to the valve door, and placing the evaporation source which is unconsumed to an empty location on the carrying platform inside the evaporation chamber region through the exchanging devices; and step 34: closing the valve door, and continuing to execute the evaporation process in the evaporation chamber region.

Wherein, the valve door is a pneumatic valve door, and each of the multiple evaporation sources includes a crucible and an evaporation material filled in the crucible.

Wherein, each of the carrying platforms and the multiple exchanging devices has a 360-degrees-rotation function such that when the substrate is located at different locations in the evaporation chamber region, the carrying platform and the exchanging devices inside the evaporation chamber region work together such that a vapor outlet of one of the evaporation sources inside the evaporation chamber region directly faces the substrate.

Wherein, each of the exchanging devices is a retractable linkage structure; one terminal of each exchanging device is fixed at a base seat and the other terminal of each exchanging device fixes a corresponding evaporation source through a fixture.

The beneficial effects of the present invention, the integration equipment for replacing an evaporation material and the use method for the same of the present invention, through a valve door to separate the interior of the equipment into an evaporation chamber region and a material replacing chamber region, and each of the evaporation chamber region and the material replacing chamber region is provided with a heating device, multiple exchanging devices. During an evaporation process, the valve door is closed, and a preheating process for the multiple evaporation sources in the evaporation chamber region and a preheating process for the multiple evaporation sources in the material replacing chamber region are both executed at the same time. When executing an evaporation material replacing process, the valve door is opened, and multiple exchanging devices exchanges the evaporation sources inside evaporation chamber region which is exhausted with the evaporation sources inside the material replacing chamber region which is unconsumed. When executing a material filling process, the valve door is closed and the material feeding door is opened, and filling an evaporation material for the evaporation source which is exchanged and exhausted inside the material replacing chamber. The whole process does not require breaking vacuum to the evaporation chamber region. A fast material replacement can be achieved. Besides, before replacing the material, the evaporation source in the material replacing chamber region is preheated so that an evaporation material reach a predetermined evaporation rate in advance. After replacing the evaporation material, a heating process for a long time does not require, and an evaporation process can be executed immediately. Comparing to the conventional art, production time waste because of opening the chamber to replace the evaporation material is greatly reduced in order to increase a production efficiency, increase a production capacity, reduce a production cost, and increase the competitiveness of an enterprise.

In order to more clearly illustrate the features of the present invention and the technology content, please refer to following detailed description and figures of the present invention. However, the figures are provided for reference and for illustrating, not for limiting the present invention.

BRIEF DESCRIPTION OF THE DRAWINGS

The following will combine the figures. Through detailed description of the specific embodiments of the present invention, the technology solution and the beneficial effects of the present invention will become obvious.

In the figures.

DETAILED DESCRIPTION OF THE PREFERRED EMBODIMENT

For further illustrating the technology solution and the effects adopted by the present invention, the following content will combine preferred embodiments and figures to describe in detail.

Figure 1:
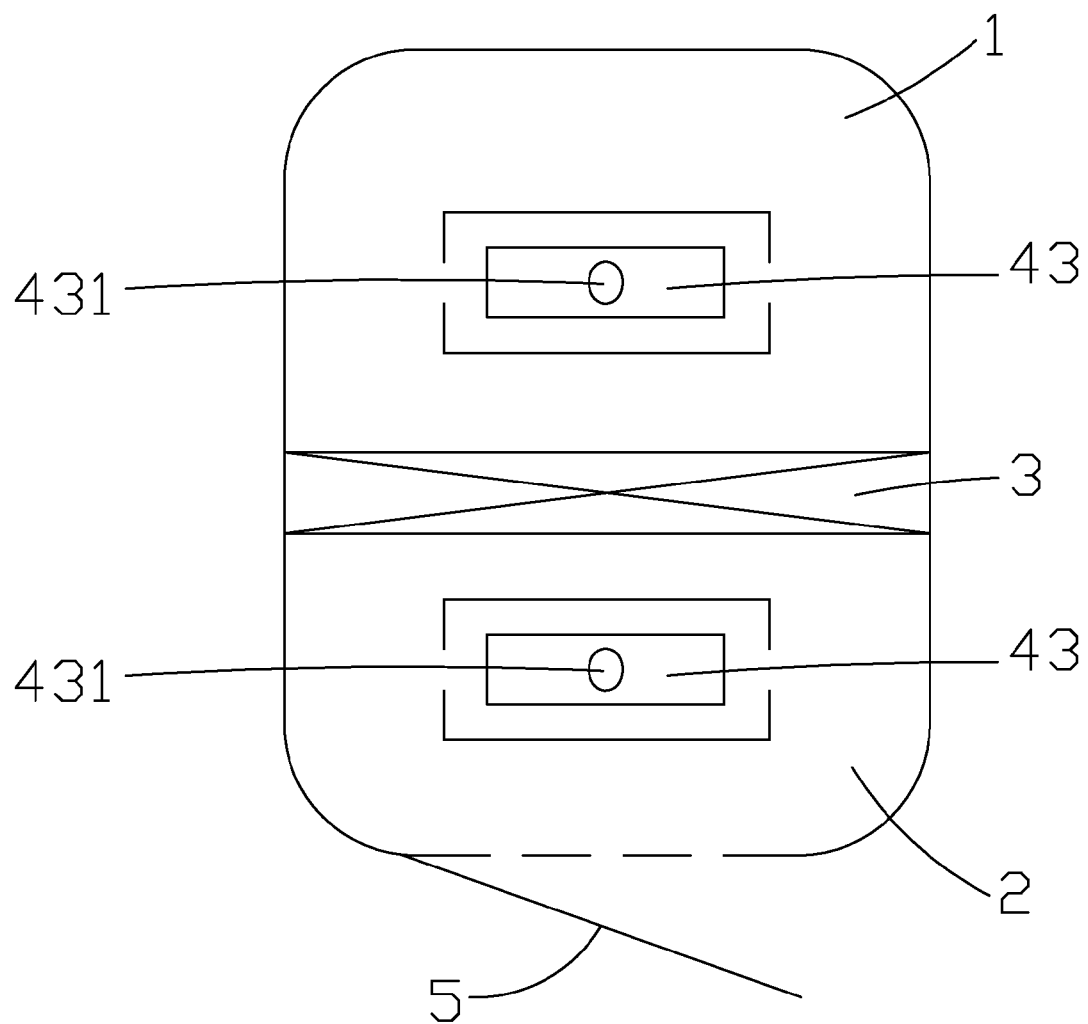
FIG. 1 is a schematic diagram of an integration equipment for replacing an evaporation material according to the present invention.
Figure 2:
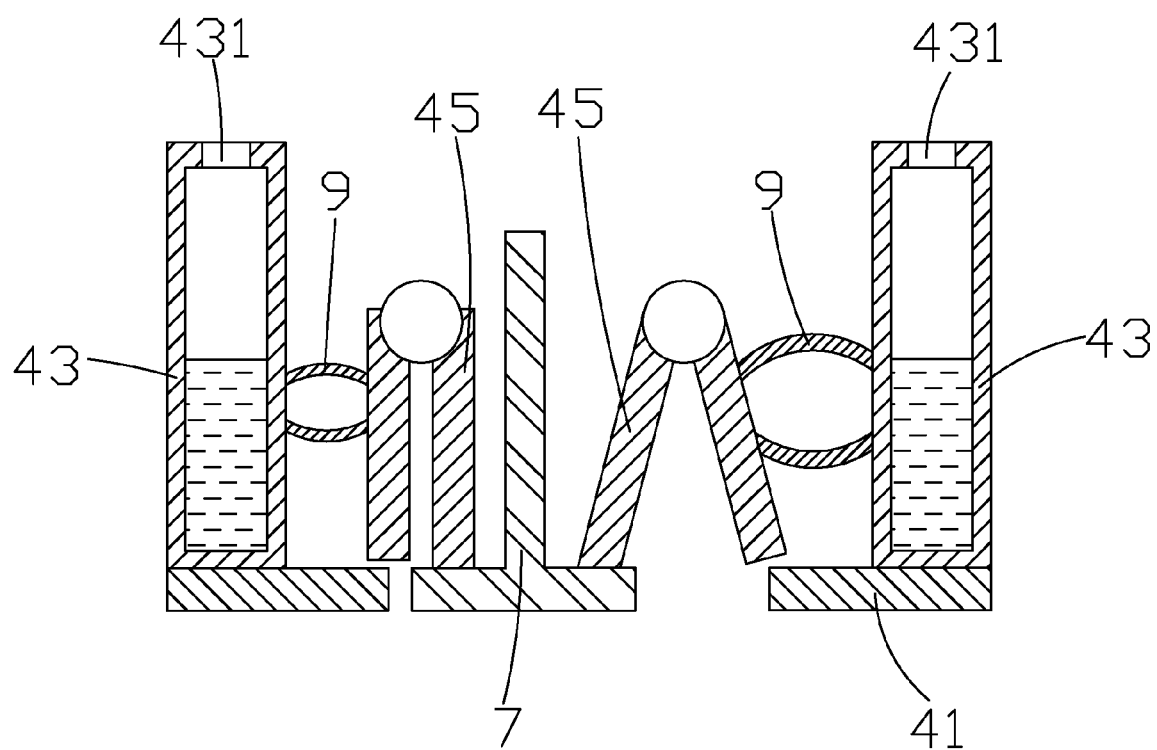
FIG. 2 is a cross-sectional view of an internal structure of an evaporation chamber region and a material replacing chamber region of the integration equipment for replacing an evaporation material according to the present invention.

With reference to FIG. 1 and FIG. 2 together, first of all, the present invention provides an integration equipment for replacing an evaporation material. The integration equipment for replacing an evaporation material includes an evaporation chamber region 1, a material replacing chamber region 2 and a valve door 3 for separating the evaporation chamber region 1 and the material replacing chamber region 2, and the valve door 3 is disposed between the evaporation chamber region 1 and the material replacing chamber region 2.

Each of the evaporation chamber region 1 and the material replacing chamber region 2 includes a carrying platform 41, multiple evaporation sources 43 disposed on the carrying platform 41, multiple exchanging devices 45 for fixing and delivering the multiple evaporation sources 43 and an independent vacuum-pumping device. A heating device is disposed inside each carrying platform 41. A substrate is provided inside the evaporation chamber region 1. A side of the material replacing chamber region 2 away from the valve door 3 is provided with a material feeding door 5.

The material replacing chamber region 2 only has to be capable of receiving multiple evaporation sources 43. The evaporation chamber region 1 has to be capable of receiving multiple evaporation sources 43 and the substrate. Therefore, a volume of the material replacing chamber region 2 is far smaller than a volume of the evaporation chamber region 1. Correspondingly, a vacuum breaking operation and a vacuum pumping operation for the material replacing chamber region 2 are simple and shorter time-consuming.

Specifically, the valve door 3 is a pneumatic valve door.

The evaporation source 43 includes a crucible and an evaporation material filled in the crucible. The evaporation material is an organic material or a LiF inorganic material.

Each of the carrying platforms 41 and the exchanging devices 45 can achieve a 360-degrees-rotation function by the conventional art such that when the substrate is located at different locations in the evaporation chamber region 1, no matter the substrate is placed horizontally or vertically, the carrying platform 41 and the exchanging devices 45 in the evaporation chamber region 1 work together such that a vapor outlet 431 of one of the evaporation sources 43 directly faces the substrate in order to guarantee that the evaporation process performs smoothly.

Each exchanging device 45 is a retractable linkage structure. One terminal of the retractable linkage structure is fixed at a base seat 7. The other terminal of the retractable linkage structure fixes the evaporation source 43 through a fixture 9. The retractable linkage structure can deliver the evaporation source 43 to a required position.

The evaporation chamber region 1 of the integration equipment for replacing an evaporation material, after vacuuming the evaporation chamber region 1 by the independent vacuum-pumping device at the first time, the interior of the evaporation chamber region 1 continuously maintains a high vacuum state below $5\times10^{-5}$ Pa. During the evaporation process, the valve door is closed. A preheating process for the evaporation source 43 in the evaporation chamber region 1 and a preheating process for the evaporation source 43 in the material replacing chamber region 2 are executed at the same time. When executing an evaporation material replacing process, the valve door is opened, and multiple exchanging devices exchanges the evaporation sources inside evaporation chamber region which is exhausted with the evaporation sources inside the material replacing chamber region which is unconsumed. When executing a material filling process, the valve door 3 is closed and the material feeding door 5 is open. In the material replacing chamber region 2, filling the material for an evaporation source 43 which is exchanged and exhausted. The whole process does not require breaking vacuum to the evaporation chamber region 1. A fast material replacement can be achieved. Besides, before replacing the material, the evaporation source 43 in the material replacing chamber region 2 is preheated so that an evaporation material reach a predetermined evaporation rate in advance. After replacing the evaporation material, a heating process for a long time does not require, and an evaporation process can be executed immediately. Comparing to the conventional art, production time waste because of opening the chamber to replace the evaporation material is greatly reduced in order to increase a production efficiency, increase a production capacity, reduce a production cost, and increase the competitiveness of an enterprise.

It should be noted that because each of the evaporation chamber region 1 and the material replacing chamber region 2 of the integration equipment for replacing an evaporation material is provided with multiple evaporation sources 43, in an evaporation process, if a portion of the evaporation material inside the evaporation chamber region 1 blocks the vapor outlet 431 of the evaporation source 43, the evaporation source 43 can be exchanged through the exchanging devices 45, and the problematic evaporation source 43 can be immediately handled in the material replacing chamber region 2. Accordingly, the evaporation process can be executed normally in order to achieve an uninterruptible and long-term production.

Figure 3:
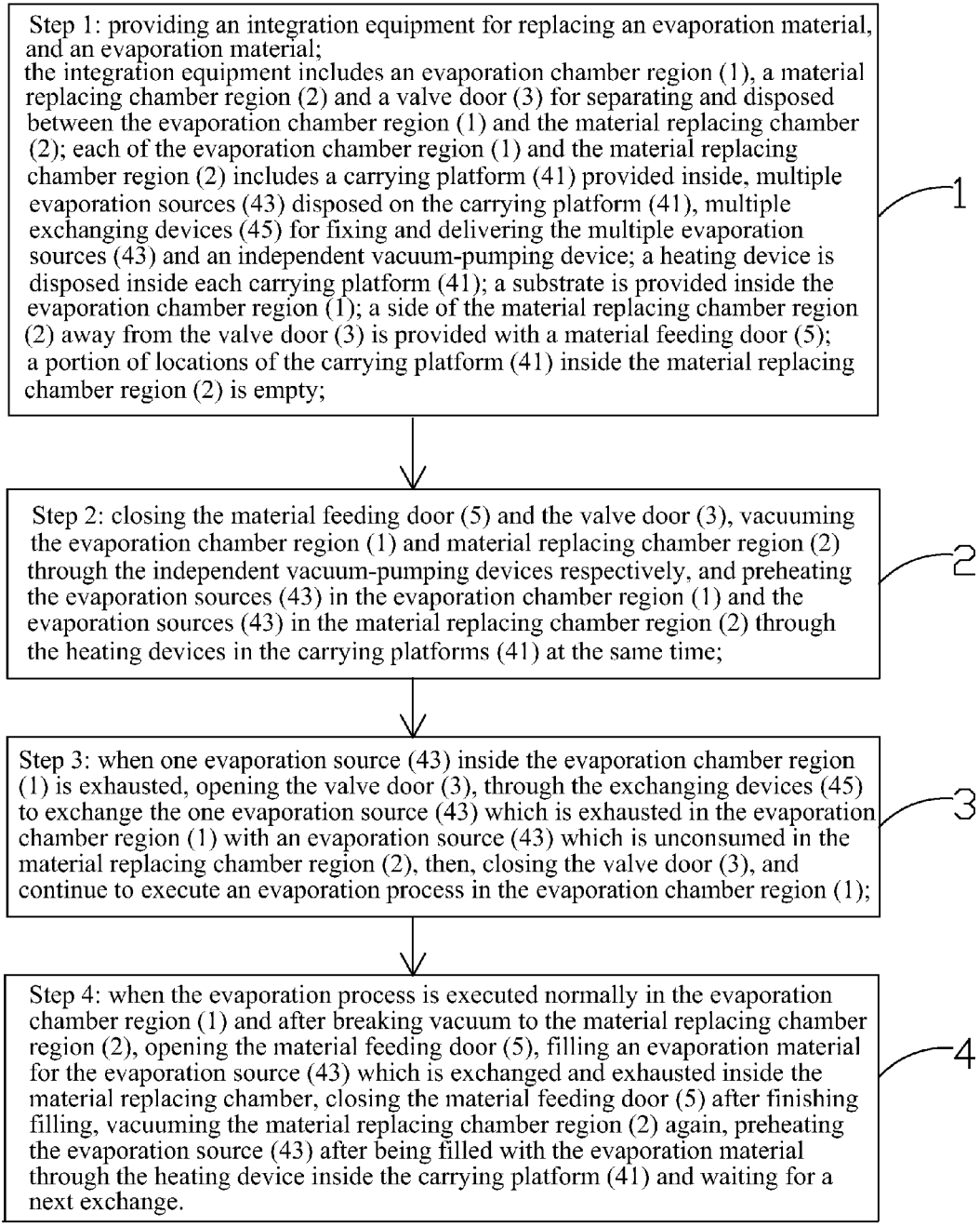
FIG. 3 is a flow chart of a use method for the integration equipment for replacing an evaporation material according to the present invention.

With reference to FIG. 3, and FIG. 3 is a flow chart of a use method for the integration equipment for replacing an evaporation material, which comprises following steps:

Step 1: providing an integration equipment for replacing an evaporation material, and an evaporation material.

With reference to FIG. 1 and FIG. 2 together, the integration equipment for replacing an evaporation material includes an evaporation chamber region 1, a material replacing chamber region 2 and a valve door 3 for separating the evaporation chamber region 1 and the material replacing chamber region 2, and the valve door 3 is disposed between the evaporation chamber region 1 and the material replacing chamber region 2.

Each of the evaporation chamber region 1 and the material replacing chamber region 2 includes a carrying platform 41 provided inside, multiple evaporation sources 43 disposed on each carrying platform 41, multiple exchanging devices 45 for fixing and delivering the multiple evaporation sources 43 and an independent vacuum-pumping device. A heating device is disposed inside each carrying platform 41. A substrate is provided inside the evaporation chamber region 1. A side of the material replacing chamber region 2 away from the valve door 3 is provided with a material feeding door 5.

A portion of locations of the carrying platform 41 inside the material replacing chamber region 2 is empty.

Specifically, the material replacing chamber region 2 has to be capable of receiving multiple evaporation sources 43. The evaporation chamber region 1 has to be capable of receiving multiple evaporation sources 43 and the substrate. Therefore, a volume of the material replacing chamber region 2 is far smaller than a volume of the evaporation chamber region 1.

Specifically, the valve door 3 is a pneumatic valve door.

Each of the evaporation sources 43 includes a crucible and an evaporation material filled in the crucible. The evaporation material is an organic material or a LiF inorganic material.

Each of the carrying platforms 41 and the exchanging devices 45 can achieve a 360-degrees-rotation function by the conventional art such that when the substrate is located at different locations in the evaporation chamber region 1, no matter the substrate is placed horizontally or vertically, the carrying platform 41 and the exchanging devices 45 inside the evaporation chamber region 1 work together such that a vapor outlet 431 of one of the evaporation sources directly faces the substrate in order to guarantee that the evaporation process performs smoothly.

Each of the exchanging devices 45 is a retractable linkage structure. One terminal of each exchanging device 45 is fixed at a base seat 7. The other terminal of each exchanging device 45 fixes a corresponding evaporation source 43 through a fixture 9. The retractable linkage structures can deliver the evaporation sources 43 to a required position.

Step 2: closing the material feeding door 5 and the valve door 3, vacuuming the evaporation chamber region 1 and material replacing chamber region 2 through the independent vacuum-pumping devices respectively, and executing a preheating process for the evaporation sources 43 in the evaporation chamber region 1 through the heating device and a preheating process for the evaporation sources 43 in the material replacing chamber region 2 through the heating device at the same time.

Step 3: when one evaporation sources 43 inside the evaporation chamber region 1 is exhausted, opening the valve door 3, through the exchanging devices 45 to exchange the one evaporation source 43 which is exhausted in the evaporation chamber region 1 with an evaporation source 43 which is unconsumed in the material replacing chamber region 2, then, closing the valve door 3, and continue to execute an evaporation process in the evaporation chamber region 1.

Specifically, the step 3 can be divided in detail with:

Step 31: moving an evaporation source 43 which is exhausted inside the evaporation chamber region 1 to the valve door 3, and opening the valve door 3;

Step 32 moving an empty location of the carrying platform 41 in the material replacing chamber region 2 to the valve door 3, placing the evaporation source 43 which is exhausted inside the evaporation chamber region 1 to the empty location through the exchanging devices 45.

Step 33: moving a location of the carrying platform 41 in the material replacing chamber region 2 corresponding to the evaporation source 43 which is unconsumed to the valve door 3, and placing the evaporation source 43 which is unconsumed to an empty location on the carrying platform 41 inside the evaporation chamber region 1 through the exchanging devices 45.

Step 34: closing the valve door 3, continue to execute the evaporation process in the evaporation chamber region 1.

The step 3 does not require breaking vacuum to the evaporation chamber region 1. Accordingly, a fast material replacement can be achieved. Besides, before replacing the material, the evaporation source 43 in the material replacing chamber region 2 is preheated so that the evaporation material already reach a predetermined evaporation rate. After replacing the evaporation material, a heating process for a long time does not require, and an evaporation process can be executed. Comparing to the conventional art, production time waste because of opening the chamber to replace the evaporation material is greatly reduced in order to increase a production efficiency, increase a production capacity, reduce a production cost, and increase the competitiveness of an enterprise.

Step 4: when the evaporation process is executed normally in the evaporation chamber region 1 and after breaking vacuum to the material replacing chamber region 2, opening the material feeding door 5, filling an evaporation material for the evaporation source 43 which is exchanged and exhausted inside the material replacing chamber, closing the material feeding door 5 after finishing filling, vacuuming the material replacing chamber region 2 again, preheating the evaporation source 43 after filled with the evaporation material through the heating device inside the carrying platform 41, and waiting for a next exchange.

In the step 4, when the evaporation chamber region 1 is maintained in a vacuum state and executing an evaporation process normally, sequentially breaking vacuum to the material replacing chamber region 2, filling an evaporation material to the evaporation source 43 which is exchanged and exhausted, and vacuuming the material replacing chamber region 2 again. Because a volume of the material replacing chamber region 2 is far smaller than a volume of the evaporation chamber region 1, breaking vacuum to the material replacing chamber region 2 and vacuuming the material replacing chamber region 2 are simple and consuming a shorter time. Besides, the normally executed evaporation process is not broken in order to save the production cost, increase a production efficiency, increase a production capacity, and reduce a production cost.

In summary, the integration equipment for replacing an evaporation material and the use method for the same of the present invention, through a valve door to separate the interior of the equipment into an evaporation chamber region and a material replacing chamber region, and each of the evaporation chamber region and the material replacing chamber region is provided with a heating device, multiple exchanging devices. During an evaporation process, the valve door is closed, and a preheating process for the multiple evaporation sources in the evaporation chamber region and a preheating process for the multiple evaporation sources in the material replacing chamber region are both executed at the same time. When executing an evaporation material replacing process, the valve door is opened, and multiple exchanging devices exchanges the evaporation sources inside evaporation chamber region which is exhausted with the evaporation sources inside the material replacing chamber region which is unconsumed. When executing a material filling process, the valve door is closed and the material feeding door is opened, and filling an evaporation material for the evaporation source which is exchanged and exhausted inside the material replacing chamber. The whole process does not require breaking vacuum to the evaporation chamber region. A fast material replacement can be achieved. Besides, before replacing the material, the evaporation source 43 in the material replacing chamber region is preheated so that an evaporation material reach a predetermined evaporation rate in advance. After replacing the evaporation material, a heating process for a long time does not require, and an evaporation process can be executed immediately. Comparing to the conventional art, production time waste because of opening the chamber to replace the evaporation material is greatly reduced in order to increase a production efficiency, increase a production capacity, reduce a production cost, and increase the competitiveness of an enterprise.

As stated above, for one person skilled in the art, other corresponding changes can be obtained according to technology solution and technology idea of the present invention. However, they are still covered by the claims in the present invention.

What is claimed is:

1. An integration equipment for replacing an evaporation material, comprising: an evaporation chamber region, a material replacing chamber region, a valve door disposed between the evaporation chamber region and the material replacing chamber region, and for separating the evaporation chamber region and the material replacing chamber region;

wherein, each of the evaporation chamber region and the material replacing chamber region includes a carrying platform, multiple evaporation sources disposed on the carrying platform, multiple exchanging devices for fixing and delivering the multiple evaporation sources, an independent vacuum-pumping device, and a heating device disposed inside the carrying platform;

wherein, a substrate disposed inside the evaporation chamber region, and a material feeding door disposed at a side of the material replacing chamber region away from the valve door;

wherein, an interior of the evaporation chamber region continuously maintains a high vacuum state; during an evaporation process, the valve door is closed, and a preheating process for the multiple evaporation sources in the evaporation chamber region and a preheating process for the multiple evaporation sources in the material replacing chamber region are both executed at the same time; when executing an evaporation material replacing process, the valve door is opened, and multiple exchanging devices exchanges the evaporation source which is exhausted inside evaporation chamber region with the evaporation source which is unconsumed inside the material replacing chamber region; when executing a material filling process, the valve door is closed and the material feeding door is opened, and filling an evaporation material for the evaporation source which is exchanged and exhausted inside the material replacing chamber.

2. The integration equipment for replacing an evaporation material according to claim 1, wherein, the valve door is a pneumatic valve door.

3. The integration equipment for replacing an evaporation material according to claim 1, wherein, each of the multiple evaporation sources includes a crucible and an evaporation material filled in the crucible.

4. The integration equipment for replacing an evaporation material according to claim 1, wherein, each of the carrying platforms and the multiple exchanging devices has a 360-degrees-rotation function such that when the substrate is located at different locations in the evaporation chamber region, the carrying platform and the exchanging devices inside the evaporation chamber region work together such that a vapor outlet of one of the evaporation sources inside the evaporation chamber region directly faces the substrate.

5. The integration equipment for replacing an evaporation material according to claim 1, wherein, each of the exchanging devices is a retractable linkage structure; one terminal of each exchanging device is fixed at a base seat and the other terminal of each exchanging device fixes a corresponding evaporation source through a fixture.

6. An integration equipment for replacing an evaporation material, comprising: an evaporation chamber region, a material replacing chamber region, a valve door disposed between the evaporation chamber region and the material replacing chamber region, and for separating the evaporation chamber region and the material replacing chamber region;

wherein, each of the evaporation chamber region and the material replacing chamber region includes a carrying platform, multiple evaporation sources disposed on the carrying platform, multiple exchanging devices for fixing and delivering the multiple evaporation sources, an independent vacuum-pumping device, and a heating device disposed inside the carrying platform;

wherein, a substrate disposed inside the evaporation chamber region, and a material feeding door disposed at a side of the material replacing chamber region away from the valve door;

wherein, an interior of the evaporation chamber region continuously maintains a high vacuum state; during an evaporation process, the valve door is closed, and a preheating process for the multiple evaporation sources in the evaporation chamber region and a preheating process for the multiple evaporation sources in the material replacing chamber region are both executed at the same time; when executing an evaporation material replacing process, the valve door is opened, and multiple exchanging devices exchanges the evaporation source which is exhausted inside evaporation chamber region with the evaporation source which is unconsumed inside the material replacing chamber region; when executing a material filling process, the valve door is closed and the material feeding door is opened, and filling an evaporation material for the evaporation source which is exchanged and exhausted inside the material replacing chamber;

wherein, the valve door is a pneumatic valve door; and wherein, each of the multiple evaporation sources includes a crucible and an evaporation material filled in the crucible.

7. The integration equipment for replacing an evaporation material according to claim 6, wherein, each of the carrying platforms and the multiple exchanging devices has a 360-degrees-rotation function such that when the substrate is located at different locations in the evaporation chamber region, the carrying platform and the exchanging devices inside the evaporation chamber region work together such that a vapor outlet of one of the evaporation sources inside the evaporation chamber region directly faces the substrate.

8. The integration equipment for replacing an evaporation material according to claim 6, wherein, each of the exchanging devices is a retractable linkage structure; one terminal of each exchanging device is fixed at a base seat and the other terminal of each exchanging device fixes a corresponding evaporation source through a fixture.

9. A use method for an integration equipment for replacing an evaporation material, comprising:

step 1: providing an integration equipment for replacing an evaporation material, and an evaporation material;

wherein, the integration equipment for replacing an evaporation material includes an evaporation chamber region, a material replacing chamber region and a valve door for separating and disposed between the evaporation chamber region and the material replacing chamber; each of the evaporation chamber region and the material replacing chamber region includes a carrying platform provided inside, multiple evaporation sources disposed on the carrying platform, multiple exchanging devices for fixing and delivering the multiple evaporation sources and an independent vacuum-pumping device; a heating device is disposed inside each carrying platform; a substrate is provided inside the evaporation chamber region; a side of the material replacing chamber region away from the valve door is provided with a material feeding door;

a portion of locations of the carrying platform inside the material replacing chamber region is empty;

step 2: closing the material feeding door and the valve door, vacuuming the evaporation chamber region and material replacing chamber region through the independent vacuum-pumping devices respectively, and executing a preheating process for the evaporation sources in the evaporation chamber region and a preheating process for the evaporation sources in the material replacing chamber region through the heating devices in the carrying platforms at the same time;

step 3: when one evaporation sources inside the evaporation chamber region is exhausted, opening the valve door, through the exchanging devices to exchange the one evaporation source which is exhausted in the evaporation chamber region with an evaporation source which is unconsumed in the material replacing chamber region, then, closing the valve door, and continue to execute an evaporation process in the evaporation chamber region; and step 4: when the evaporation process is executed normally in the evaporation chamber region and after breaking vacuum to the material replacing chamber region, opening the material feeding door, filling an evaporation material for the evaporation source which is exchanged and exhausted inside the material replacing chamber, closing the material feeding door after finishing filling, vacuuming the material replacing chamber region again, preheating the evaporation source after being filled with the evaporation material through the heating device inside the carrying platform, and waiting for a next exchange.

10. The use method for an integration equipment for replacing an evaporation material according to claim 9, wherein the step 3 specifically includes:

step 31: moving an evaporation source which is exhausted inside the evaporation chamber region to the valve door, and opening the valve door;

step 32: moving an empty location of the carrying platform in the material replacing chamber region to the valve door, placing the evaporation source which is exhausted inside the evaporation chamber region to the empty location through the exchanging devices;

step 33: moving a location of the carrying platform in the material replacing chamber region corresponding to the evaporation source which is unconsumed to the valve door, and placing the evaporation source which is unconsumed to an empty location on the carrying platform inside the evaporation chamber region through the exchanging devices; and step 34: closing the valve door, and continuing to execute the evaporation process in the evaporation chamber region.

11. The use method for an integration equipment for replacing an evaporation material according to claim 9, wherein, the valve door is a pneumatic valve door, and each of the multiple evaporation sources includes a crucible and an evaporation material filled in the crucible.

12. The use method for an integration equipment for replacing an evaporation material according to claim 9, wherein, each of the carrying platforms and the multiple exchanging devices has a 360-degrees-rotation function such that when the substrate is located at different locations in the evaporation chamber region, the carrying platform and the exchanging devices inside the evaporation chamber region work together such that a vapor outlet of one of the evaporation sources inside the evaporation chamber region directly faces the substrate.

13. The use method for an integration equipment for replacing an evaporation material according to claim 9, wherein, each of the exchanging devices is a retractable linkage structure; one terminal of each exchanging device is fixed at a base seat and the other terminal of each exchanging device fixes a corresponding evaporation source through a fixture.

* * * * *